United States Patent
Zubkov et al.

(10) Patent No.: US 7,115,991 B1
(45) Date of Patent: Oct. 3, 2006

(54) METHOD FOR CREATING BARRIERS FOR COPPER DIFFUSION

(75) Inventors: Vladimir Zubkov, Mountain View, CA (US); Sheldon Aronowitz, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 191 days.

(21) Appl. No.: 10/044,864

(22) Filed: Oct. 22, 2001

(51) Int. Cl.
*H01L 23/54* (2006.01)

(52) U.S. Cl. .................. 257/751; 257/752; 257/762; 257/760; 257/741; 257/744; 257/773; 257/739; 432/643; 432/634; 432/627; 432/653

(58) Field of Classification Search ........... 257/751, 257/752, 762, 760, 741, 744, 773, 739, 632, 257/17, 19, 700, 701, 706, 712, 713, 720; 438/627, 643, 634, 637, 704, 687, 927, 725, 438/694, 723, 757, 740, 692; 317/234, 235
See application file for complete search history.

(56) References Cited

U.S. PATENT DOCUMENTS

| | | | | |
|---|---|---|---|---|
| 3,632,438 A | * | 1/1972 | Carlson et al. | 438/476 |
| 3,710,205 A | * | 1/1973 | Swanson | 257/66 |
| 4,352,716 A | * | 10/1982 | Schaible et al. | 156/643 |
| 6,057,223 A | * | 5/2000 | Lanford et al. | 438/618 |
| 6,077,775 A | * | 6/2000 | Stumborg et al. | 438/643 |
| 6,083,794 A | | 7/2000 | Hook et al. | |
| 6,083,818 A | * | 7/2000 | Stumborg et al. | 438/603 |
| 6,117,770 A | * | 9/2000 | Pramanick et al. | 438/659 |
| 6,211,066 B1 | * | 4/2001 | Stumborg et al. | 438/627 |
| 6,226,173 B1 | * | 5/2001 | Welsch et al. | 361/508 |
| 6,261,963 B1 | * | 7/2001 | Zhao et al. | 438/704 |
| 6,355,555 B1 | * | 3/2002 | Park | 438/634 |
| 6,441,492 B1 | * | 8/2002 | Cunningham | 257/762 |
| 6,566,247 B1 | * | 5/2003 | Stumborg et al. | 438/627 |
| 6,633,085 B1 | | 10/2003 | Besser et al. | |
| 6,703,307 B1 | | 3/2004 | Lopatin et al. | |
| 6,703,308 B1 | | 3/2004 | Besser et al. | |
| 6,881,669 B1 | * | 4/2005 | Chu et al. | 438/653 |
| 2001/0035581 A1 | * | 11/2001 | Stumborg et al. | 257/751 |
| 2001/0040238 A1 | * | 11/2001 | Stumborg et al. | 257/73 |
| 2002/0076925 A1 | * | 6/2002 | Marieb et al. | 438/678 |
| 2003/0057526 A1 | * | 3/2003 | Chung et al. | 257/642 |

FOREIGN PATENT DOCUMENTS

JP 63290559 11/1998

* cited by examiner

*Primary Examiner*—Nathan J. Flynn
*Assistant Examiner*—Fazil Erdem
(74) *Attorney, Agent, or Firm*—Beyer, Weaver & Thomas

(57) ABSTRACT

A barrier layer for a semiconductor device is provided. The semiconductor device comprises a dielectric layer, an electrically conductive copper containing layer, and a barrier layer separating the dielectric layer from the copper containing layer. The barrier layer comprises a silicon oxide layer and a dopant, where the dopant is a divalent ion, which dopes the silicon oxide layer adjacent to the copper containing layer.

A method of forming a barrier layer is provided. A silicon oxide layer with a surface is provided. The surface of the silicon oxide layer is doped with a divalent ion to form a barrier layer extending to the surface of the silicon oxide layer. An electrically conductive copper containing layer is formed on the surface of the barrier layer, where the barrier layer prevents diffusion of copper into the substrate.

11 Claims, 7 Drawing Sheets

METHOD FOR CREATING BARRIERS FOR COPPER DIFFUSION

FIELD OF THE INVENTION

The present invention relates generally to the creation of a diffusion barrier layer. More specifically, the invention relates to the creation of a diffusion barrier layer for copper.

BACKGROUND OF THE INVENTION

The use of copper interconnects in semiconductor devices may require a barrier layer to surround the copper interconnect to prevent $Cu^+$ ions from diffusing into a silicon oxide dielectric, also called silicon dioxide or oxide. Copper diffusion into an oxide may give rise to various detrimental phenomena, which may include poisoning of an active device. Current barrier layers may include titanium (Ti), tantalum (Ta), and derivatives of these metals such as nitrides and carbides of these metals. Silicon nitrides and carbides are also being employed as effective barriers. One example of a silicon carbide barrier layer would provide a first silicon carbide layer, on which a thick oxide deposition is placed. Another silicon carbide layer is placed over the oxide deposition. Another oxide deposition is placed over the second silicon carbide layer. The silicon carbide acts as a barrier for copper diffusion.

To avoid increasing the dielectric constant of the oxide, barrier layers should be thin. Current methods of forming barrier layers may be too porous or may be difficult to control to provide a thin barrier layer or may not be sufficiently pure.

It would be desirable to create thin barrier layers that have a high purity and low porosity, which may be more effective as barrier layers.

SUMMARY OF THE INVENTION

To achieve the foregoing and other objects and in accordance with the purpose of the present invention, a semiconductor device is provided. The semiconductor device comprises a dielectric layer, an electrically conductive copper containing layer, and a barrier layer separating the dielectric layer from the copper containing layer. The barrier layer comprises a silicon oxide layer and a dopant, where the dopant is a divalent ion, which dopes the silicon oxide layer adjacent to the copper containing layer.

In addition, a method of forming a barrier layer is provided. A silicon oxide layer with a surface is provided. The surface of the silicon oxide layer is doped with a divalent ion to form a barrier layer extending to the surface of the silicon oxide layer. An electrically conductive copper containing layer is formed on the surface of the barrier layer, where the barrier layer prevents diffusion of copper into the substrate.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
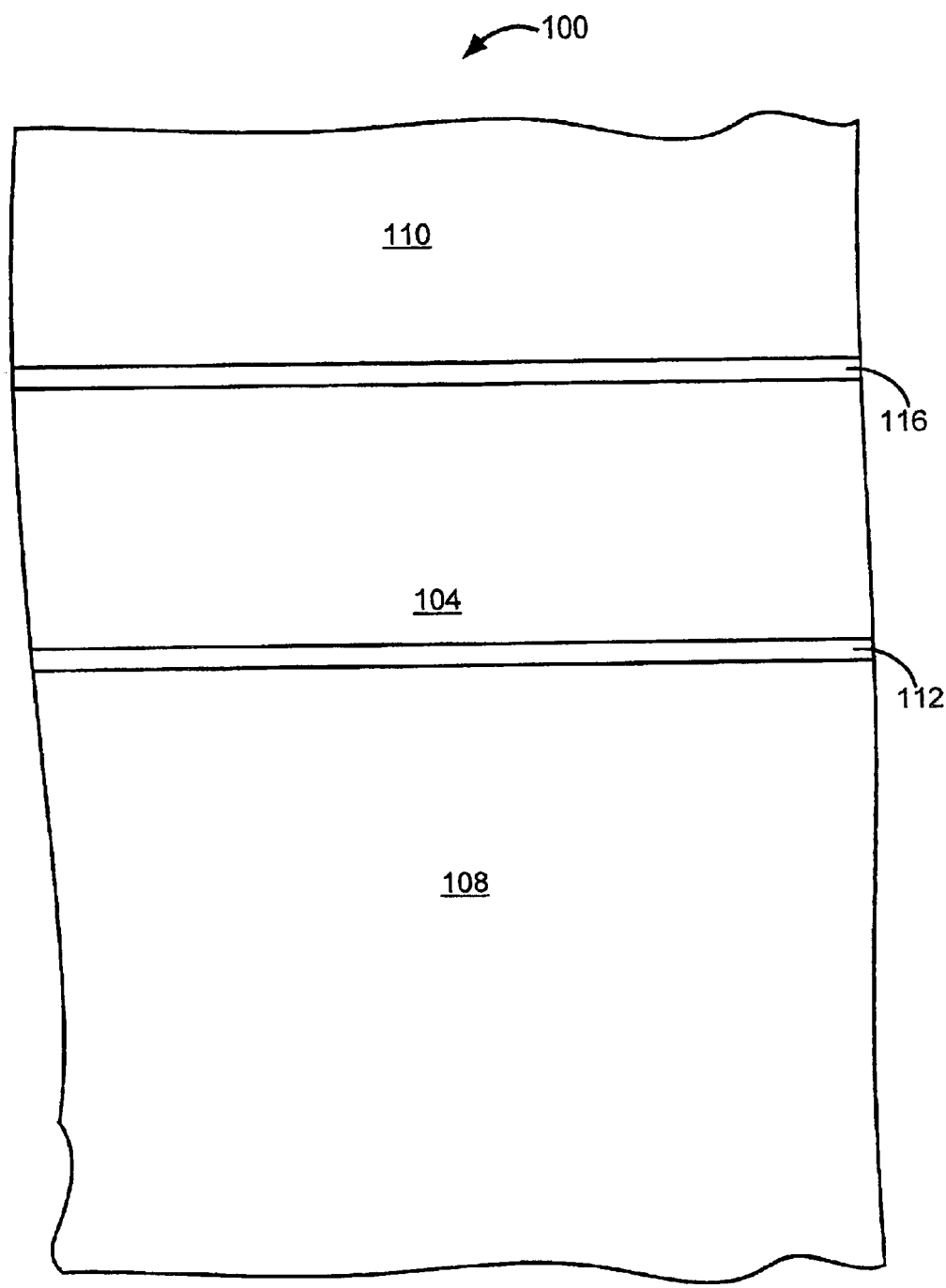
FIG. 1 is a schematic cross-sectional partial view of a semiconductor device.

To facilitate understanding, FIG. 1 is a schematic cross-sectional partial view of a semiconductor device 100. The semiconductor device 100 may comprise an electrically conductive copper containing interconnect 104. A first dielectric layer 108 is below part of the copper containing interconnect 104. A second dielectric layer 110 is placed above the copper containing electrically conducting interconnect 104. A first barrier layer 112 separates the copper containing interconnect 104 from the first dielectric layer 108. A second barrier layer 116 separates the copper containing interconnect 104 from the dielectric layer 110. The copper containing interconnect 104 may provide an electronic connection to a source or drain or another part of a semiconductor device.

The first barrier layer 112 and the second barrier layer 116 are formed from silicon oxide doped with a divalent ion dopant. Divalent ions are ions of elements from Groups IIa and IIb of the Periodic Table of Elements, although it is uncertain if all divalent ions would provide the desired barrier. More preferably, the dopant is selected from the group of beryllium, magnesium, calcium, strontium, and barium. In another preferred embodiment, the dopant is calcium. The dopant concentration may be measured by the ratio of dopant ions to silicon atoms in the silicon oxide. It is preferable that the ratio of dopant ions to silicon atoms be in the range from about 1:10 to 1:100. It is more preferable that the ratio of the dopant ions to silicon atoms be in the range from 1:10 to 1:30. Most preferably, the ratio of the dopant ions to silicon atoms is about 1:20. Preferably, the silicon oxide is amorphous silicon oxide.

In other semiconductor devices, the inventive barrier layer may be placed on only one side of a copper containing layer, where another type of barrier layer or no barrier layer may be placed on the other side of the copper containing layer. In addition, another type of dielectric may be used in the place of the undoped areas of silicon oxide.

Without being bound by theory, it is believed that the insertion of a divalent ion, such as calcium, into silicon oxide results in a barrier to $Cu^+$ diffusion through oxide. Analysis based on quantum chemical results showed that interaction of atomic calcium with a siloxane ring leads to insertion of the calcium atom into the ring. $Cu^+$ ions interacting with a siloxane ring containing an inserted calcium atom form several stable structures, which are complexes of $Cu^+$ with the ring with $Cu^+$ inserted within. The most favorable in energy are four structures, which are three complexes of $Cu^+$ with the ring containing an inserted atom of Ca (I, III, IV) and one (II) with $Cu^+$ inserted into the ring and a Ca atom above the ring.

Figure 2:
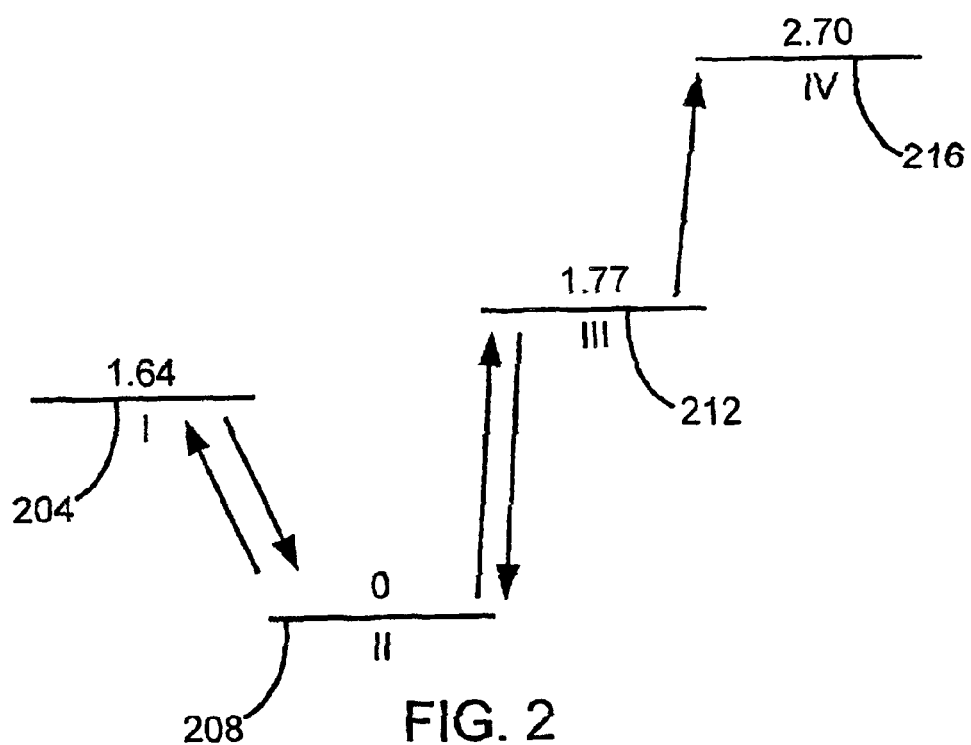
FIG. 2 is a schematic illustration of the different energy levels of $Cu^+$ and silicon oxide structures.

FIG. 2 is a schematic illustration of the different energy levels in eV of the four structures. Structure I 204 is a complex of silicon oxide ring and $Cu^+$, which has an energy level 1.64 eV higher than the energy level of structure II 208, which is a silicon oxide ring with $Cu^+$ inserted within the ring. Structure III 212 is a complex of silicon oxide ring and $Cu^+$, which has an energy level 1.77 eV higher than the energy level of structure II 208. Structure IV 216 is a complex of silicon oxide ring and $Cu^+$, which has an energy level 2.70 eV higher than the energy level of structure II. In structures I–III, $Cu^+$ is closer to Ca than in the structure IV. In the vicinity of the Ca, $Cu^+$ will be mostly in the most energetically favorable structure II. This can be considered as a trap since attraction of $Cu^+$ to the ring is very strong, >4 eV. Diffusion of $Cu^+$ implies that $Cu^+$ jumps from one ring to another. The lowest energy pathways are II→I and II→III→IV, as only from structures I and IV can $Cu^+$ move from one ring to another. According to this scheme, diffusion activation energies, $E_a$, exceed 1.6–1.7 eV as $E_a$ is always larger than the energy difference between states, $\Delta E$, i.e., $\Delta E$ is the lowest estimate of $E_a$.

The results obtained for $Cu^+$ interaction with pure oxide and pure nitride rings confirm that the energy difference between states for the above case is sufficient for preventing $Cu^+$ diffusion. In the case of oxide and nitride, $Cu^+$ forms two stable complexes with basic ring units. Copper diffusion is determined on a microscopic level by the energy $E_a$ for $Cu^+$ jump from a more stable complex to a less stable one. Values of $\Delta E$ for these jumps are 0.37 and 1.57 eV for oxide and nitride, respectively. These values correlate with experimental data that nitride is a good barrier for $Cu^+$ diffusion in contrast with oxide for which $\Delta E$ is quite small. $\Delta E$ for $Cu^+$ interaction with Ca containing oxide rings being calculated to be 1.6–1.7 eV, indicates that an oxide with Ca inserted should serve as a barrier for $Cu^+$ diffusion. The other possible dopants described above are also considered as candidates for implantation into silicon oxide for generating barriers for $Cu^+$ diffusion.

Without wishing to be bound by theory, silicon oxide forms a ring of alternating silicon and oxygen atoms. There may be from about two to six silicon atoms in the ring. Normally without a divalent dopant, a $Cu^+$ ions sits above a ring and jumps from ring to ring to diffuse into the silicon oxide and poison it. However, by placing a Ca ion in about one ring for every two or four adjacent rings, a $Cu^+$ ion will tend to replace the Ca in the ring and the Ca ion will be placed above the ring. It is believed that such a configuration provides energy level structure II. Such a configuration having energy level so much lower than the other energy level structures traps the $Cu^+$. It is believed that a single Ca ion is sufficient for two or three rings.

Figure 3:
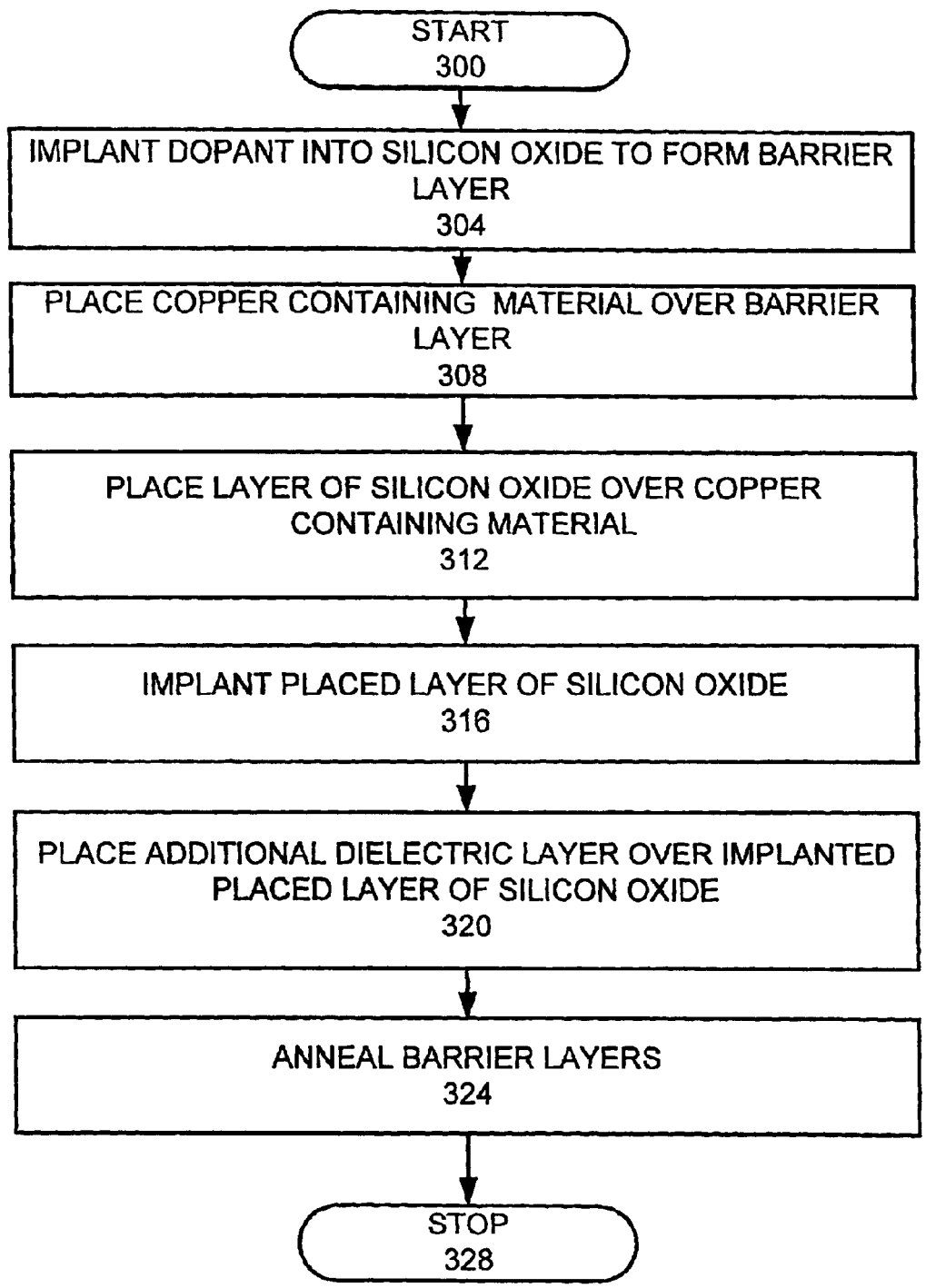
FIG. 3 is a flow chart of a process for manufacturing the inventive barrier layer.

FIG. 3 is a flow chart of a process for manufacturing the inventive barrier layer. A dopant is implanted into a silicon oxide layer to form a barrier layer, such as the first barrier layer 112 in FIG. 1 (step 304). In one embodiment, the entire first dielectric layer 108 may be amorphous silicon oxide. If the dopant is calcium, $2\times10^{15}$ Ca/cm² may be implanted at an energy of 10 keV, so that 98%, of the calcium ions would be confined within the first 190 Å of the silicon oxide, forming the first barrier layer 112 with a thickness of about 350 Å. In another embodiment, a calcium dopant may be implanted at a concentration of $4\times10^{15}$ Ca/cm² at an energy of 20 keV, so that 98% of the calcium ions would be confined within the first 340 Å of the silicon oxide, forming the first barrier layer 112 with a thickness of about 600 Å. A copper containing layer 104 is then deposited over the barrier layer (step 308). A thin silicon oxide layer is then placed over the copper containing layer (step 312). The thin silicon oxide layer is implanted with a dopant (step 316). If the thin silicon oxide layer is 350 Å thick, an implantation of calcium at a concentration of $2\times10^{15}$ Ca/cm² at an energy of 10 keV would cause almost the entire layer to become a barrier layer, such as the second barrier layer. If the silicon oxide layer is 600 Å thick, an implantation of calcium at a concentration of $4\times10^{15}$ Ca/cm² at an energy of 20 keV would cause almost the entire layer to become a barrier layer, such as the second barrier layer 116. An additional dielectric layer may then be placed over the second barrier layer (step 320). The dielectric forming the dielectric layer may be silicon oxide. The barrier layers may then be annealed (step 324). The entire semiconductor device may be heated to a temperature of about 600° C. to provide annealing, which facilitates optimal calcium insertion into the silicon oxide and lateral dispersion of the dopant in forming the barrier layer. The above doping concentrations provide the desired dopant-to-silicon-oxide ratio.

An alternative method of forming the barrier layers may be performed by exposing the silicon oxide layers to plasmas of the dopant ion. A calcium ion plasma would provide a lower energy Ca implantation with a higher flux. The lower energy may provide a thinner barrier layer. In other embodiments, a combination of implantations and plasma may be used to more easily create the inventive barrier layer on the side walls of the vias and trenches of a dual damascene process. Other methods may also be used to create the inventive barrier layer.

Figure 4:
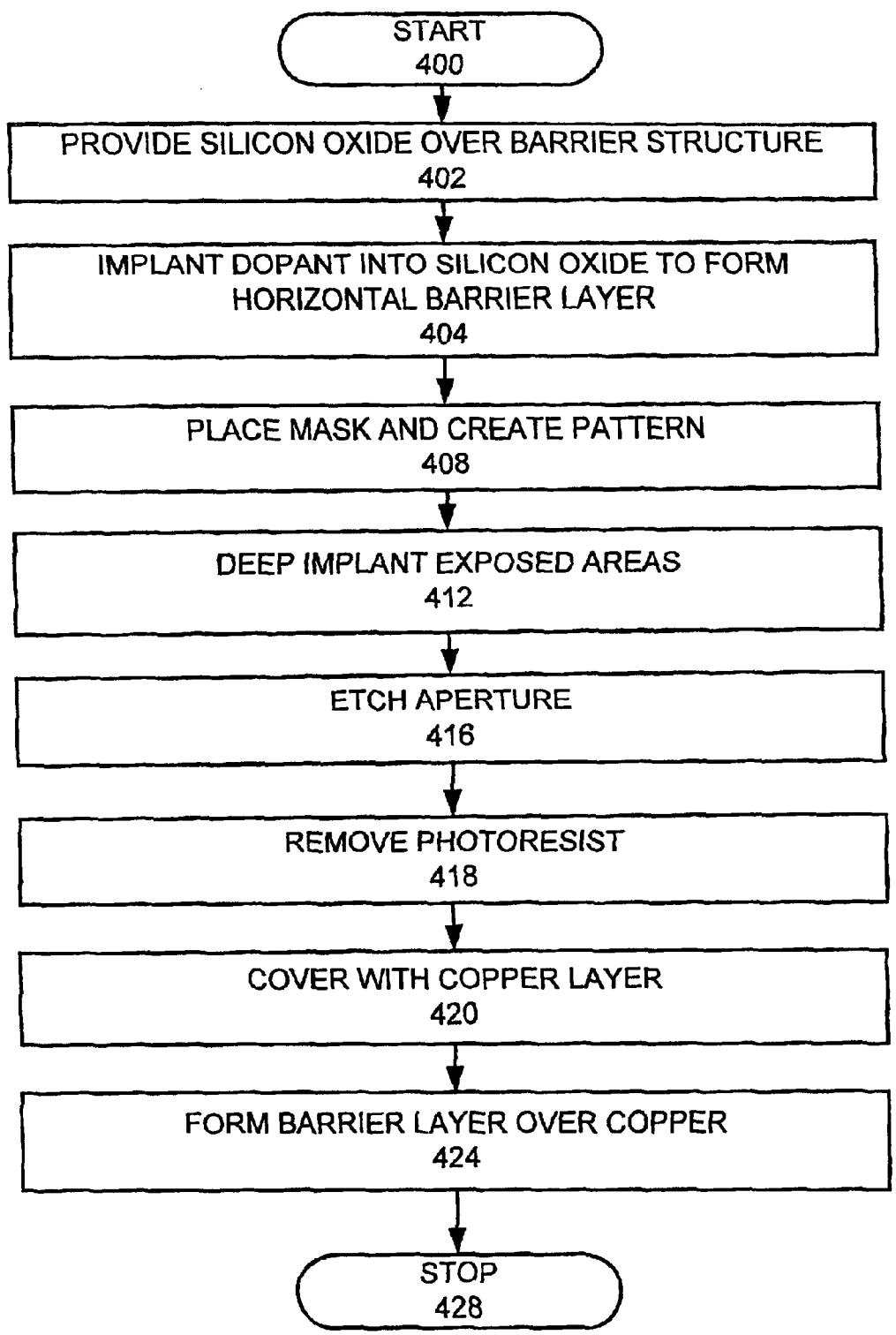
FIG. 4 is a flow chart of a process that may be used in an embodiment of the invention to provide a barrier layer for a damascene structure.
Figure 5:
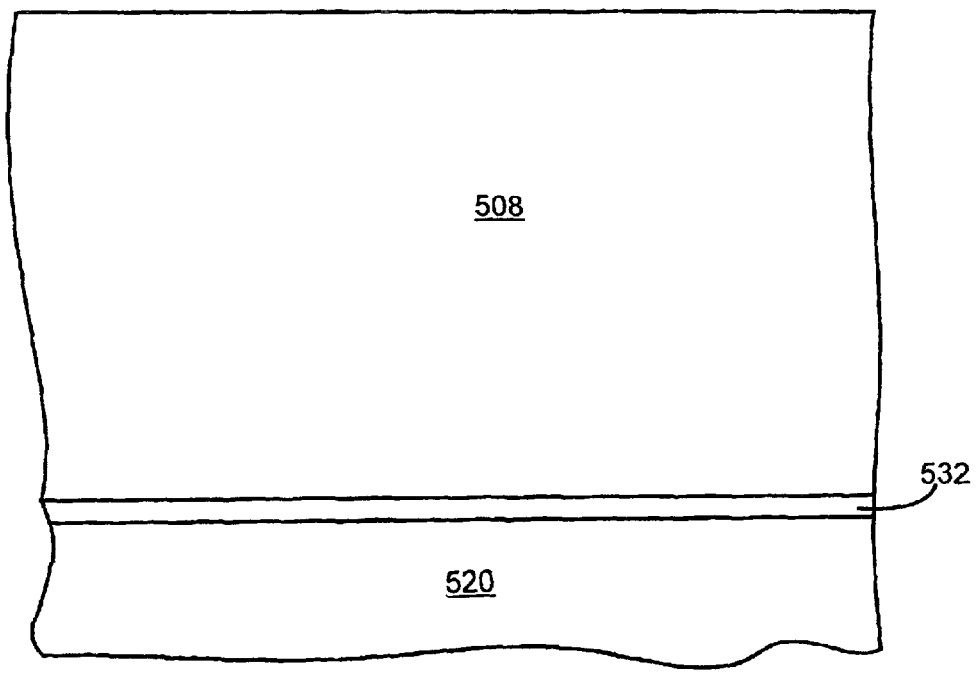
FIG. 5 is a cross-sectional view of silicon oxide on a substrate during the formation of a copper damascene interconnect.

Copper interconnects may be used in a damascene type structure. In damascene structures, a via, trench, or both via and trench may be etched in a dielectric. It may be desirable to place the barrier layer on both horizontal surfaces of a dielectric and vertical surfaces forming sidewalls of vias and trenches. FIG. 4 is a flow chart of a process that may be used in an embodiment of the invention to provide a barrier layer for a damascene structure. A silicon oxide damascene structure is provided (step 402). FIG. 5 illustrates an example of a silicon oxide damascene structure. In this example, a silicon oxide 508 is formed over a substrate 520, which in this example is a conductive copper layer. A barrier layer 532 is placed between the silicon oxide damascene structure 508 and the substrate 520.

Figure 6:
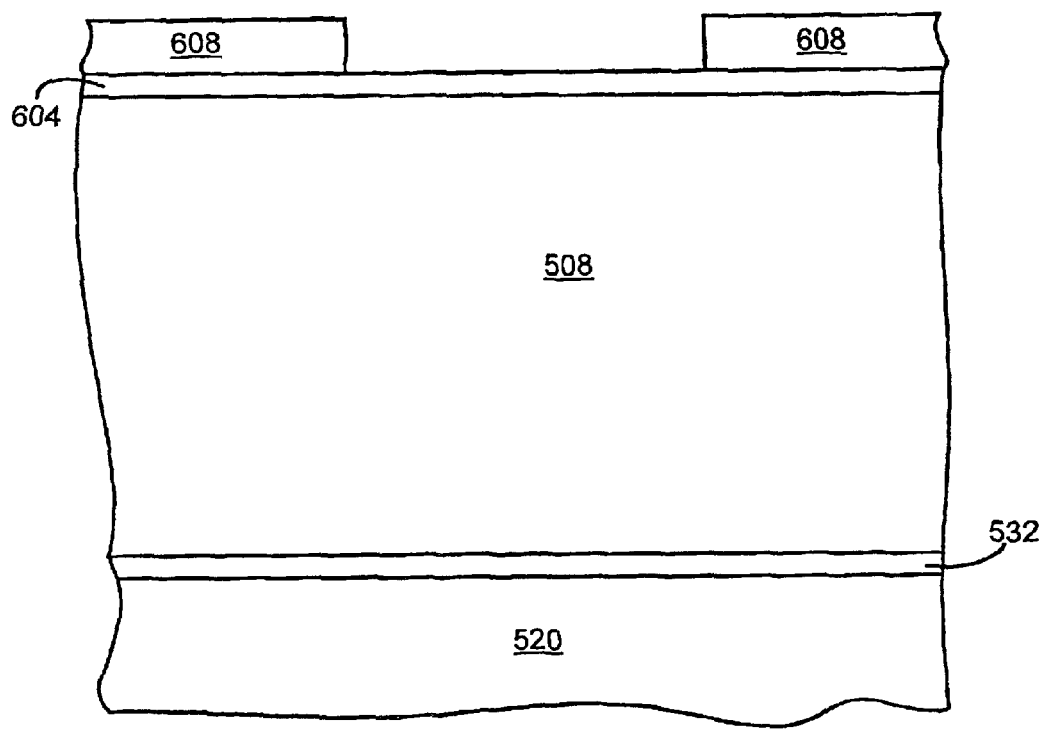
FIG. 6 is a cross-sectional view of the structure illustrated in FIG. 5 after a mask has been formed.

A divalent ion dopant is then implanted into horizontal surfaces of the silicon oxide (step 404). Such a doping may be performed using any of the above-described methods, such as a 10–20 keV ion implantation or plasma implantation. FIG. 6 is a view of the structure after the divalent ion dopant has been implanted. The implantation forms a horizontal barrier layer 604. A patterned photoresist 608 is then formed over parts of the barrier layer 604.

Figure 7:
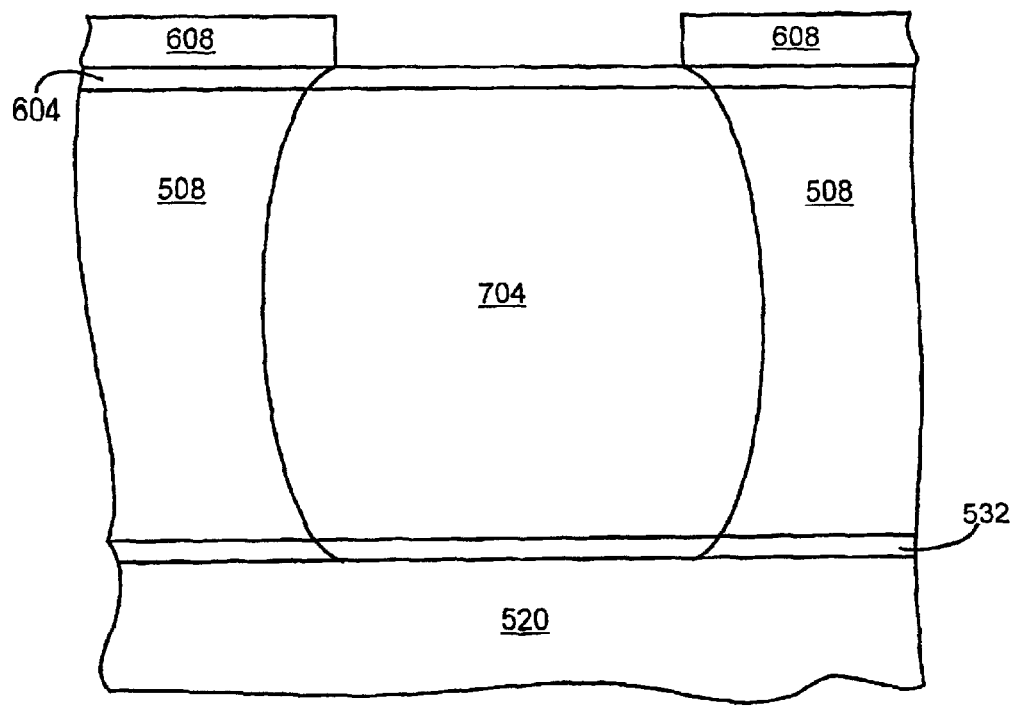
FIG. 7 is a cross-sectional view of the structure illustrated in FIG. 6 after a deep implant has been formed.
Figure 8:
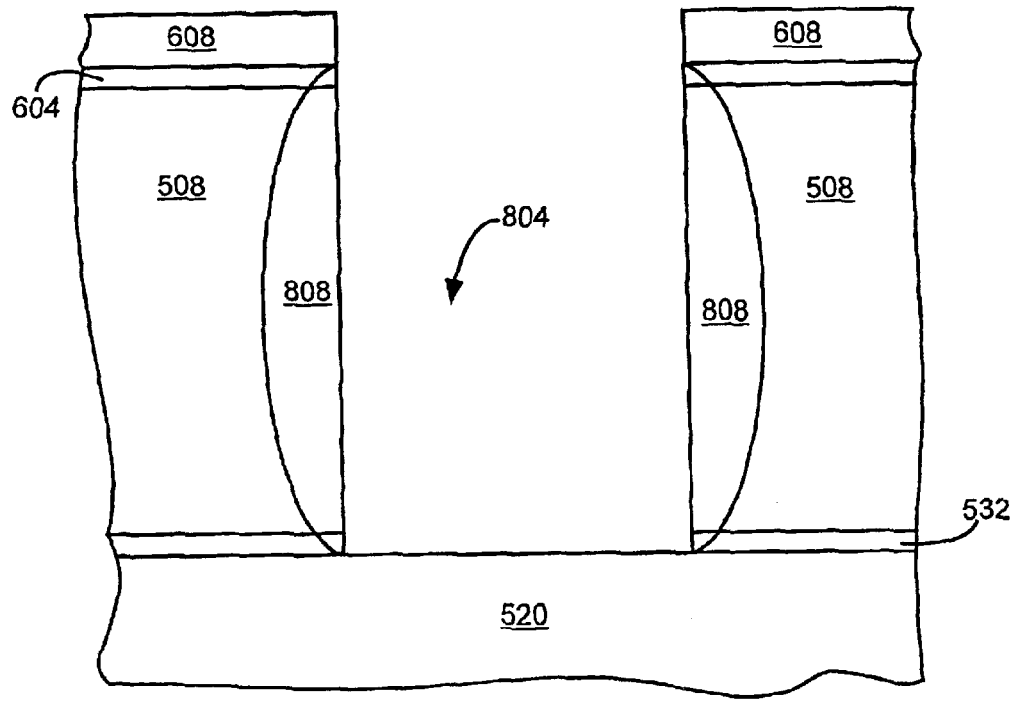
FIG. 8 is a cross-sectional view of the structure illustrated in FIG. 7 after an aperture has been etched.

A deep implant of a divalent ion is then provided (step 412) forming an implant region 704 within the parts of the silicon oxide 508 exposed by the via patterned photoresist 608, as shown in FIG. 7. The implant energy should be sufficient to provide most of the implanted divalent ions to a location midway through the silicon oxide 508. The number of ions implanted should be so that a sufficient concentration of divalent ions is provided near the top and bottom of the via. Since a higher concentration of implanted divalent ions would be provided midway along the sidewall, the ions midway would tend to diffuse further into the silicon oxide, causing a bowing of the implant region 704, as shown. The patterned photoresist 608 may then be used to etch an aperture 804 (step 416), as shown in FIG. 8. The aperture 804 may be used to form a trench or a via or both. The unetched parts of the implant region form a barrier layer 808 for the sidewalls of the aperture 804. In this example, the unetched parts of the implant region may be formed by lateral diffusion of the dopant.

Figure 9:
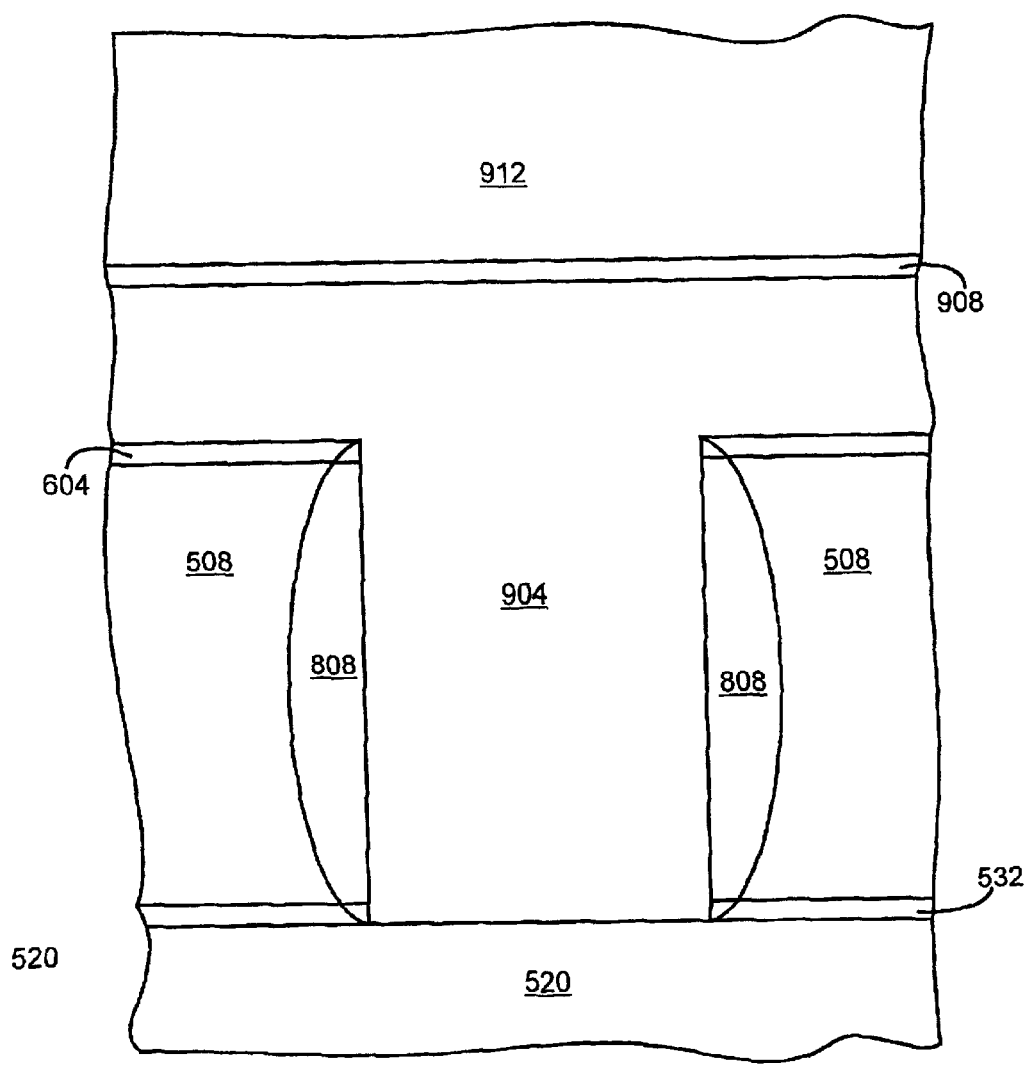
FIG. 9 is a cross-sectional view of the structure illustrated in FIG. 8 after a copper layer has been provided.

The photoresist 608 is then removed (step 418). The horizontal barrier layer 604 and the sidewall barrier layer 808 may be covered with a copper layer 904 (step 420), as shown in FIG. 9. The copper layer 904 fills the via or trench, forming a copper damascene interconnect. A barrier layer 908 may then be formed over the copper layer 904 (step 424), using the method described in the earlier embodiments, or by using a conventional barrier forming method. A dielectric layer 912 may be placed over the barrier layer 908 formed over the copper layer 904.

These methods provide a thin barrier layer with low porosity and high purity. By use of a silicon oxide layer doped with a divalent ion with low porosity and high purity, a thin barrier layer is provided which is able to be an effective barrier layer.

In another embodiment of the invention, the deep implant of step 412 may be performed before the patterned mask is placed (step 408). This would cause the entire silicon oxide layer 508 to become a barrier layer. The remaining steps are performed. Since the entire silicon oxide layer 508 is doped with a divalent ion, the entire silicon oxide layer 508 may be a copper barrier.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A semiconductor device, comprising:
    a dielectric layer;
    an electrically conductive copper containing layer; and
    a barrier layer, separating the dielectric layer from the copper containing layer, comprising a silicon oxide layer doped with divalent ion dopant, wherein a ratio of dopant ions to silicon oxide molecules adjacent to the copper layer is within the range from 1:2 to 1:6.

2. The semiconductor device, as recited in claim 1, wherein the dopant is selected from the group containing beryllium, magnesium, calcium, strontium, and barium.

3. The semiconductor device, as recited in claim 1, wherein the dopant is calcium.

4. The semiconductor device, as recited in claim 3, wherein a ratio of calcium ions to silicon oxide molecules adjacent to the copper layer is within the range from 1:3 to 1:4.

5. The semiconductor device, as recited in claim 3, wherein at least about 98% of the calcium dopant is within the silicon oxide in a region that extends from a surface of the barrier layer adjacent to the copper containing layer to a depth of less than about 340Å.

6. The semiconductor device, as recited in claim 3, wherein at least about 98% of the calcium dopant is within the silicon oxide in a region that extends from a surface of the barrier layer adjacent to the copper containing layer to a depth of less than about 170Å.

7. The semiconductor device, as recited in claim 5, wherein the barrier layer is a first barrier layer on a first side of the copper containing layer, and further comprising a second barrier layer on a second side of the copper containing layer, wherein the second barrier layer comprises:
    silicon oxide; and
    a dopant, wherein the dopant is a divalent ion, which dopes the silicon oxide adjacent to the copper containing layer.

8. The semiconductor device, as recited in claim 1, wherein a ratio of dopant ions to silicon oxide molecules adjacent to the copper layer is within the range from 1:3 to 1:4.

9. A semiconductor device comprising:
    a dielectric layer;
    an electrically conductive copper containing layer; and
    a barrier layer, separating the dielectric layer from the copper containing layer, comprising a silicon oxide layer doped with divalent ion dopant, where at least about 98% of the dopant is within the silicon oxide in a region that extends from a surface of the barrier layer adjacent to the copper containing layer to a depth of less than about 340 Å.

10. A semiconductor device comprising:
    a dielectric layer;
    an electrically conductive copper containing layer; and
    a barrier layer, separating the dielectric layer from the copper containing layer, comprising a silicon oxide layer doped with divalent ion dopant, wherein at least about 98% of the dopant is within the silicon oxide in a region that extends from a surface of the barrier layer adjacent to the copper containing layer to a depth of less than about 170 Å.

11. The semiconductor device, as recited in claim 1, wherein the barrier layer is a first barrier layer on a first side of the copper containing layer, and further comprising a second barrier layer on a second side of the copper containing layer, wherein the second barrier layer comprises:
    silicon oxide; and
    a dopant, wherein the dopant is a divalent ion, which dopes the silicon oxide adjacent to the copper containing layer.

* * * * *